(12) United States Patent
Lin et al.

(10) Patent No.: US 7,730,617 B2
(45) Date of Patent: Jun. 8, 2010

(54) METHOD FOR CONNECTING HEAT-DISSIPATING BODY AND HEAT PIPE AND STRUCTURE THEREOF

(75) Inventors: Kuo-Len Lin, Wugu Township, Taipei County (TW); Ken Hsu, Wugu Township, Taipei County (TW); Chih-Hung Cheng, Wugu Township, Taipei County (TW)

(73) Assignees: Cpumate Inc., Taipei (TW); Golden Sun News Techniques Co., Ltd, Taipei (TW)

( * ) Notice: Subject to any disclaimer, the term of this patent is extended or adjusted under 35 U.S.C. 154(b) by 311 days.

(21) Appl. No.: 11/563,005

(22) Filed: Nov. 23, 2006

(65) Prior Publication Data

US 2008/0121377 A1 May 29, 2008

(51) Int. Cl.
*B23P 6/00* (2006.01)
(52) U.S. Cl. ............... 29/890.032; 29/890.04; 29/725; 165/104.11; 165/104.33
(58) Field of Classification Search .............. 29/890.04, 29/890.032, 726; 156/197; 165/104.33
See application file for complete search history.

(56) References Cited

U.S. PATENT DOCUMENTS 4,180,897 A * 1/1980 Chester .................. 29/890.04

* cited by examiner

*Primary Examiner*—Rick K Chang
(74) *Attorney, Agent, or Firm*—Chun-Ming Shih

(57) ABSTRACT

A method for connecting a heat-dissipating body and a heat pipe and the structure thereof are used to improve the efficiency of heat conduction. The structure includes a heat-dissipating body and a heat pipe. The central position of the heat-dissipating body is provided with an accommodating trough for accommodating the heat pipe. A plurality of corresponding slots extends outwardly from the periphery of the trough. The other end of the slot is connected to a through hole. Tools are disposed in the slots to widen the slots and thus the periphery of the trough, so that the inner diameter of the trough is larger than the outer diameter of the heat pipe. After the heat pipe penetrates into the trough, the tools are removed, so that the inner wall surface of the trough abuts tightly against the outer circumferential surface of the heat pipe. Thus, the optimal efficiency of heat conduction between the heat pipe and the heat-dissipating body can be achieved.

8 Claims, 7 Drawing Sheets

METHOD FOR CONNECTING HEAT-DISSIPATING BODY AND HEAT PIPE AND STRUCTURE THEREOF

BACKGROUND OF THE INVENTION

1. Field of the Invention

The present invention relates to a heat-dissipating device, and in particular to a heat-dissipating structure having a heat pipe.

2. Description of Prior Art

With the progress of technology and modern materials, the current electronic products have more and more functions, and the volume thereof is gradually compacted. Since the electronic product is gradually compacted and exhibits high performance, the heat generated thereby is inevitably increased to a large extent. The heat generated by the electronic product will directly affect the operation and life thereof, and thus it is very important for the electronic industry to develop how to enhance the heat-dissipating effect.

The heat-dissipating device having a heat pipe is one of the common heat-dissipating solutions. The structure thereof includes a heat pipe and a heat-dissipating body. The principle of heat dissipation is explained as follows. First, one end of the heat pipe is directly or indirectly brought into contact with an electronic element. The working fluid and the capillary structure disposed within the heat pipe are used to absorb the heat generated by the electronic element. Then, the absorbed heat is conducted onto the heat-dissipating body to perform the heat-dissipating action. Such kind of heat-dissipating means has an advantage of small weight. Further, it can reduce the noise, weight, and cost resulted from the heat-dissipating device and the complexity of the whole system. Moreover, it can conduct a great amount of heat without consuming electricity, and thus has become an important way of dissipating heat.

The above way of dissipating heat indeed has some advantages, however, gaps are inevitably formed during the assembly of the heat pipe and the heat-dissipating body, so that the heat conduction between the heat pipe and the heat-dissipating body is greatly affected. Therefore, the heat-dissipating effect of the whole heat-dissipating device will be directly affected. In order to solve the thus-formed gap, according to later conventional art, a heat-conducting medium such as heat-conducting glue is applied onto the outer surface of the heat pipe, thereby to fill the gap formed during the assembly of the heat pipe and the heat-dissipating body. In this way, the heat conducting between the heat pipe and the heat-dissipating body can be enhanced.

However, filling the gap with the heat-conducting medium still has some drawbacks. Since the heat-conducting medium applied on the heat pipe is in a liquid phase, it is prone to be scraped off during the assembly of the heat pipe and the heat-dissipating body, and thus the filling effect cannot be achieved. Even, this results in environmental pollution and the waste of cost. Therefore, according to the above, how to use a more effective way of assembly to enhance the heat conduction between the heat pipe and the heat-dissipating body has become an important issue for those skilled in this art.

SUMMARY OF THE INVENTION

In view of the above drawbacks, the present invention is to provide a method for connecting a heat-dissipating body and a heat pipe and the structure thereof. By providing slots at the periphery of a trough in which the heat pipe is received, widening the slots by tools to cause the widening of the inner diameter of the trough, inserting the heat pipe into the trough, and finally removing the tools. In this way, a structure in which the heat pipe and the heat-dissipating body are tightly connected can be achieved. With the above structure, not only the tightness between the heat pipe and the heat-dissipating body is increased, but also the efficiency of heat conduction therebetween is improved. Further, it conforms to the requirements for environmental protection and reduces the cost.

Accordingly, the present invention provides a method for connecting a heat-dissipating body and a heat pipe and the structure thereof. The structure comprises a heat-dissipating body and a heat pipe. The central position of the heat-dissipating body is provided with an accommodating trough for accommodating the heat pipe. A plurality of corresponding slots extends outwardly from the periphery of the trough. The other end of the slot is connected to a through hole. Tools are disposed in the slots to widen the slots and thus the periphery of the trough, so that the inner diameter of the trough is larger than the outer diameter of the heat pipe. After the heat pipe penetrates into the trough, the tools are removed, so that the inner wall surface of the trough abuts tightly against the outer circumferential surface of the heat pipe. Thus, the optimal efficiency of heat conduction between the heat pipe and the heat-dissipating body can be achieved.

DETAILED DESCRIPTION OF THE INVENTION

The technical contents and the detailed description of the present invention will be made with reference to the accompanying drawings.

Figure 1:
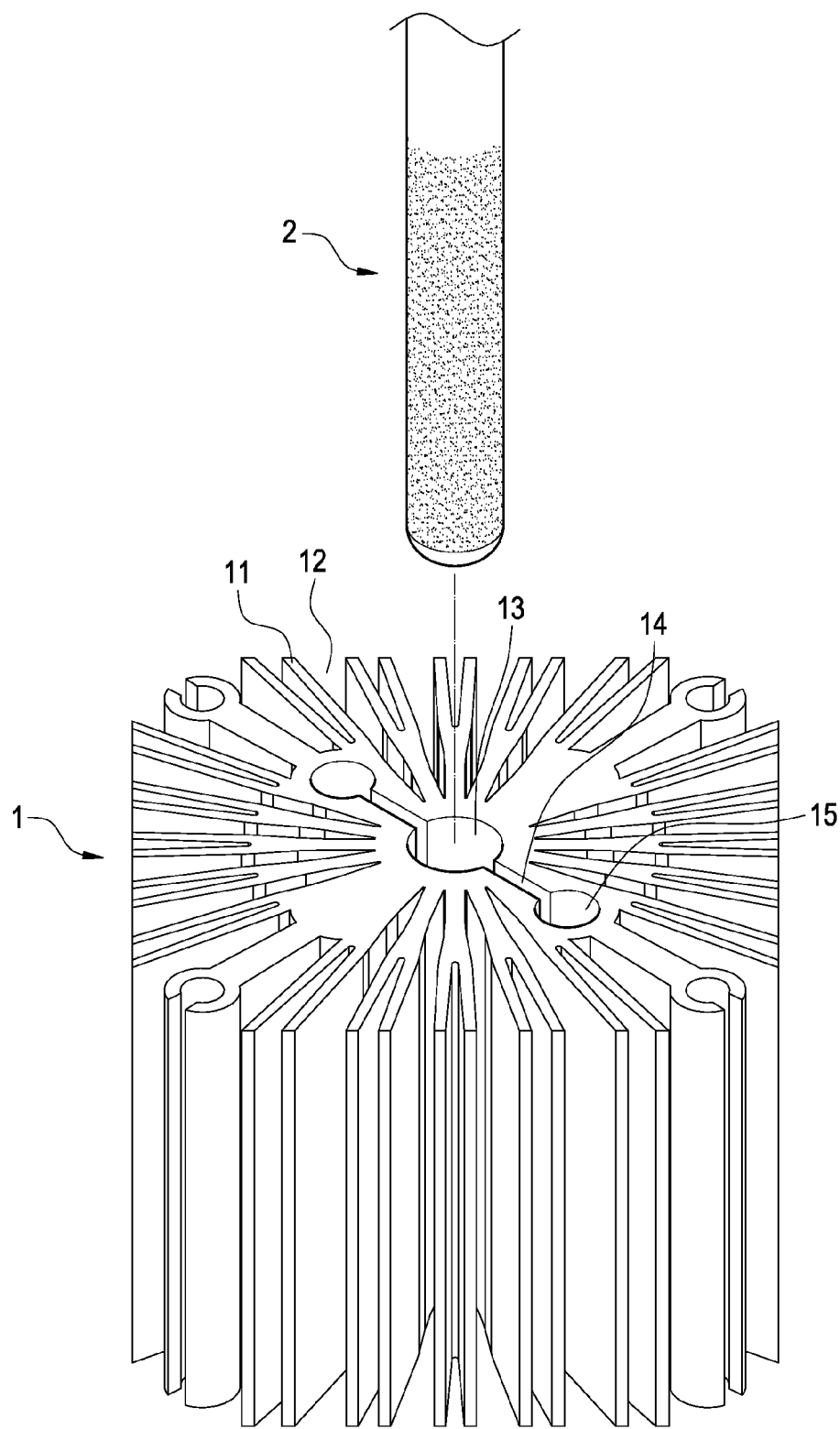
FIG. 1 is an exploded perspective view showing the structure of the present invention.

With reference to FIG. 1, it is a perspective view showing the structure of the present invention. As shown in the figure, the heat-dissipating structure of the present invention comprises a heat-dissipating body 1 and a heat pipe 2. The heat-dissipating body 1 has a plurality of radial heat-dissipating pieces 11. A gap 12 is formed between each heat-dissipating piece 11 to serve as a heat-dissipating path for the heat-dissipating pieces 11. Further, the central position of the heat-dissipating body 1 is provided with an accommodating trough 13. The cross section of the trough 13 is formed into a circular shape. The trough 13 penetrates through the heat-dissipating body 1 for accommodating the heat pipe 2. In other words, the trough 13 extends from one end surface of the heat-dissipating body 1 to another opposite end surface of the heat-dissipating body 1. A plurality of corresponding slots 14 extend outwardly from the periphery of the trough 13. The plurality of slots 14 forms a straight line. The other end of the slot 14 is connected to a through hole 15. The slots 14 communicate with the trough 13 and the through hole 15. The trough 13, the slots 14, and the through hole 15 are juxtaposedly formed in the heat-dissipating body 1. Thus, the slots 14 also extend from one end surface of the heat-dissipating body 1 to another opposite end surface of the heat-dissipating body 1. The profile of the heat pipe 2 is formed into a cylindrical shape and the heat pipe 2 is accommodated in the trough 13 of the heat dissipating body 1. The size of the outer periphery of the heat pipe 2 is exactly the same as that of the inner edge of the trough 13. Therefore, when the heat pipe 2 is disposed in the trough 13, the outer circumferential surface of the heat pipe 2 abuts tightly against the inner wall of the trough 13. A working fluid and a capillary structure are provided in the heat pipe 2 for conducting heat, which are conventional and thus the description thereof is omitted.

Figure 2:
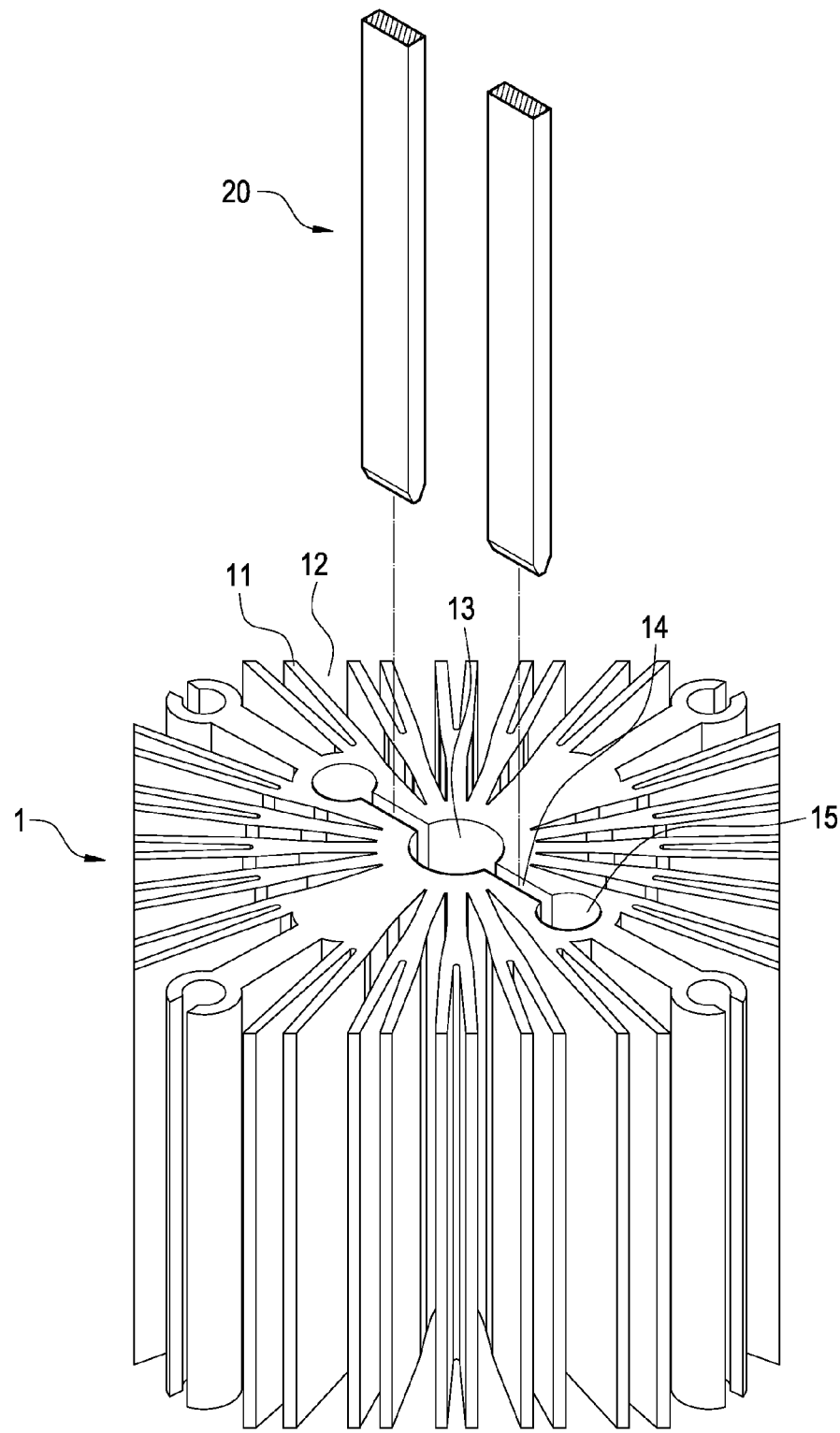
FIG. 2 is a schematic view (I) showing the procedure of the present invention.
Figure 3:
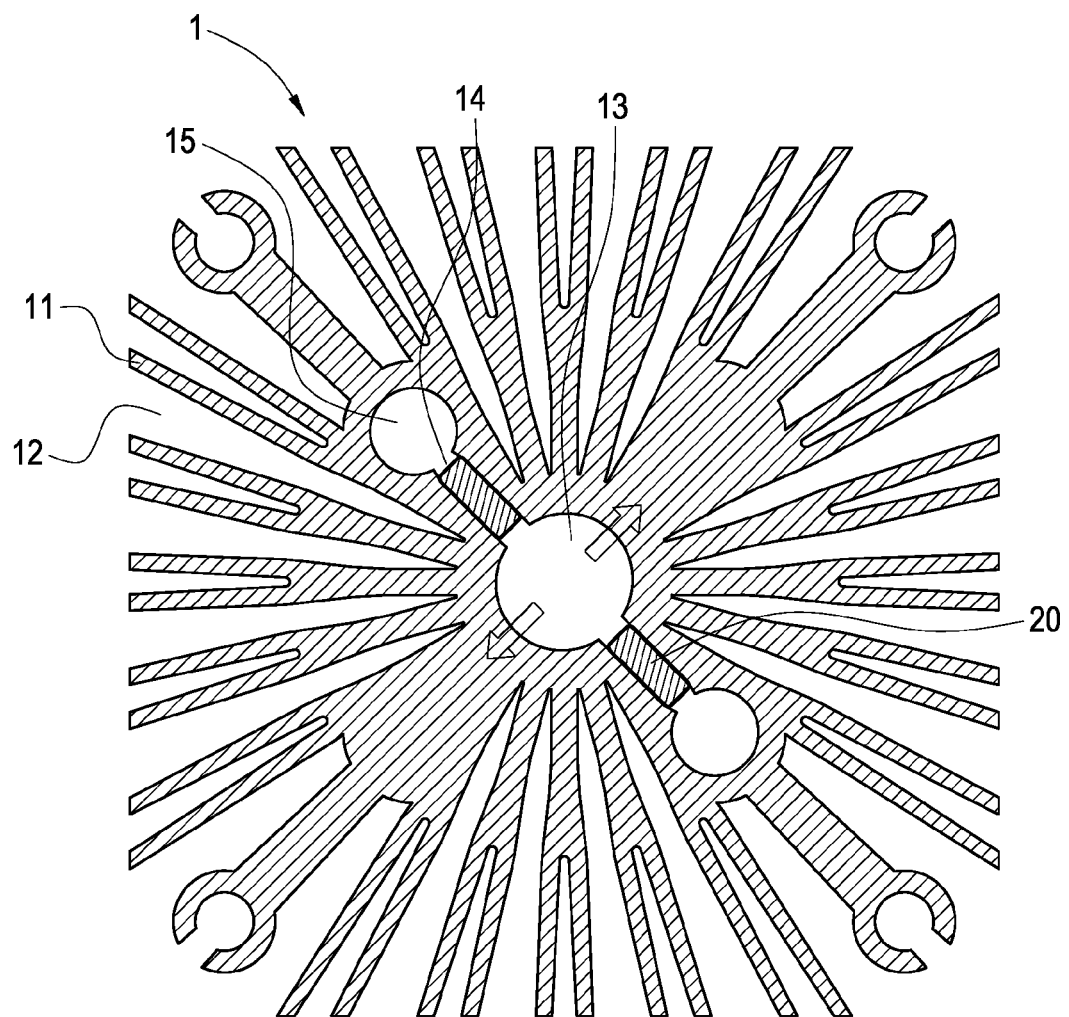
FIG. 3 is a schematic view (II) showing the procedure of the present invention.
Figure 4:
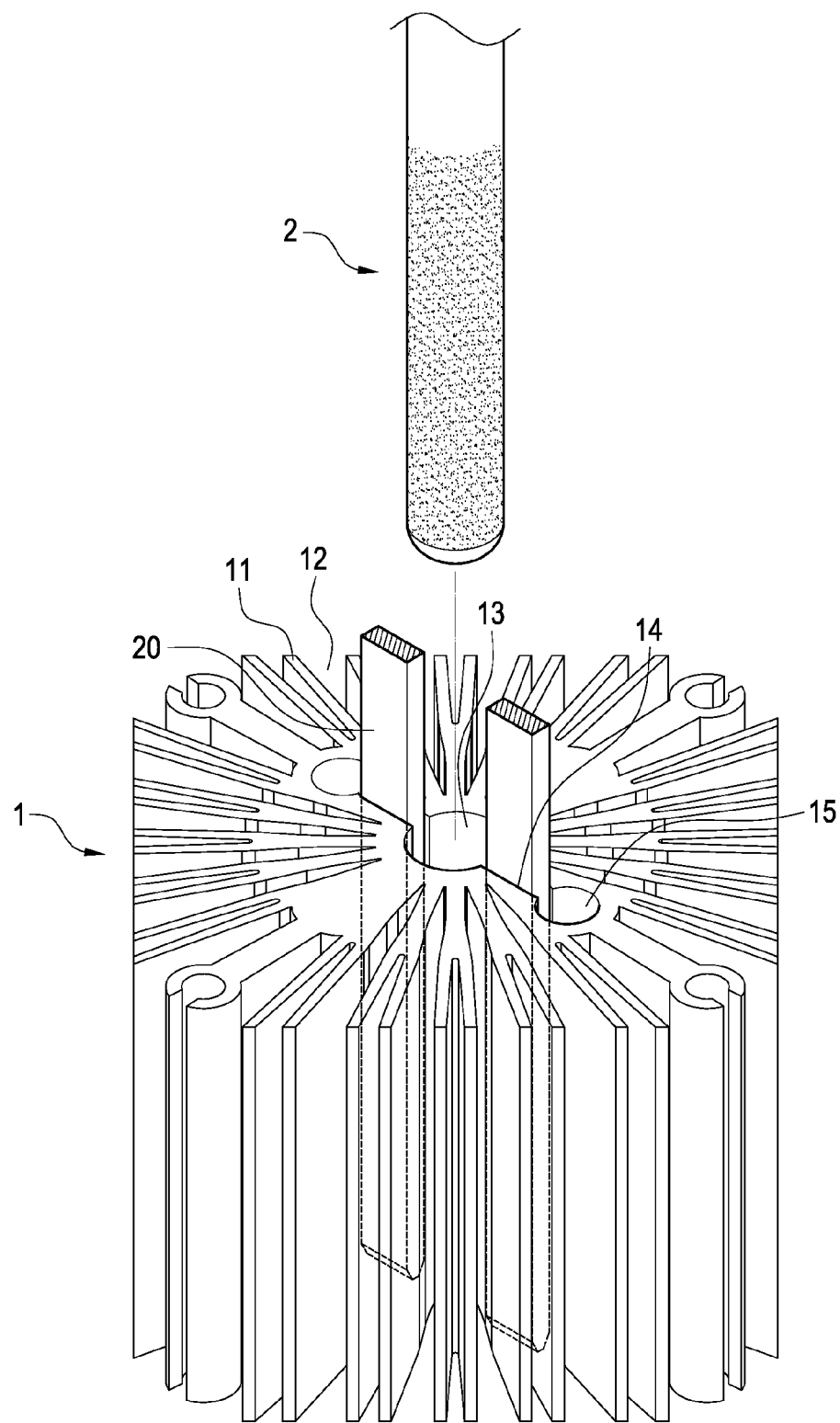
FIG. 4 is a schematic view (III) showing the procedure of the present invention.
Figure 5:
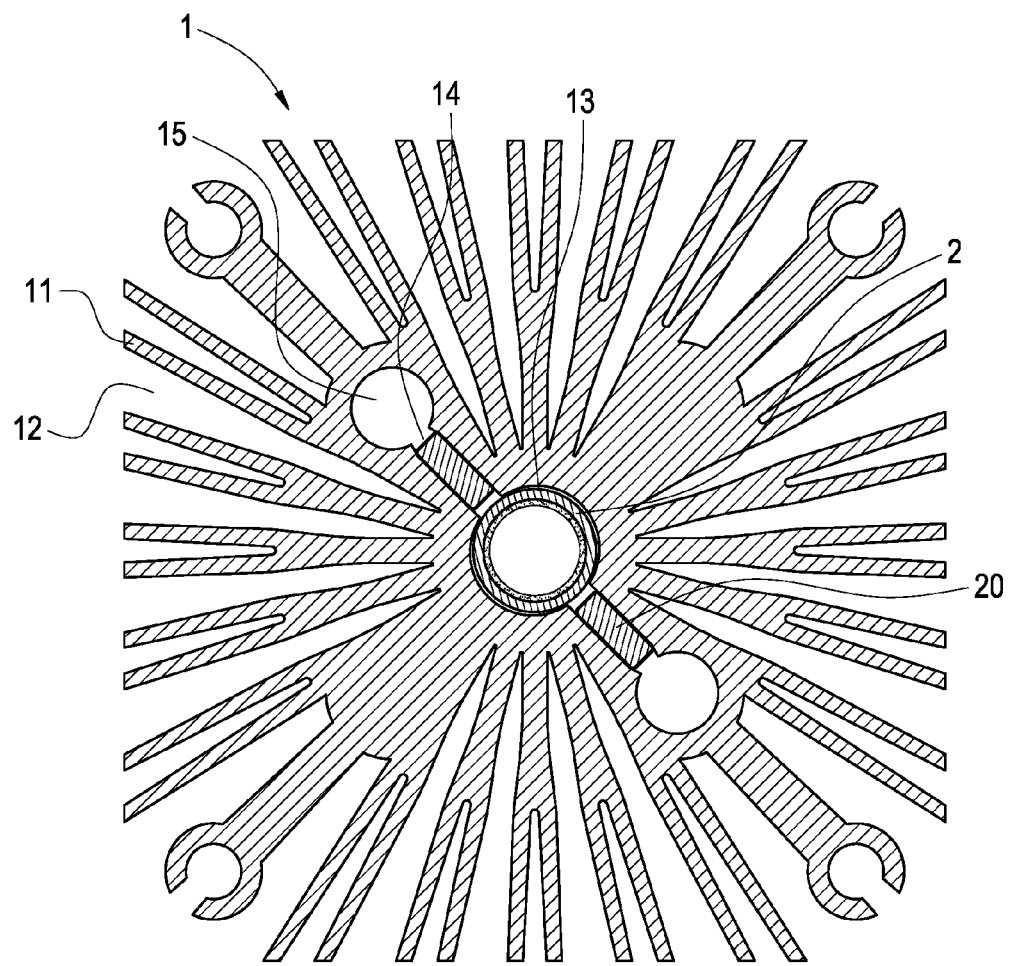
FIG. 5 is a schematic view (IV) showing the procedure of the present invention.
Figure 6:
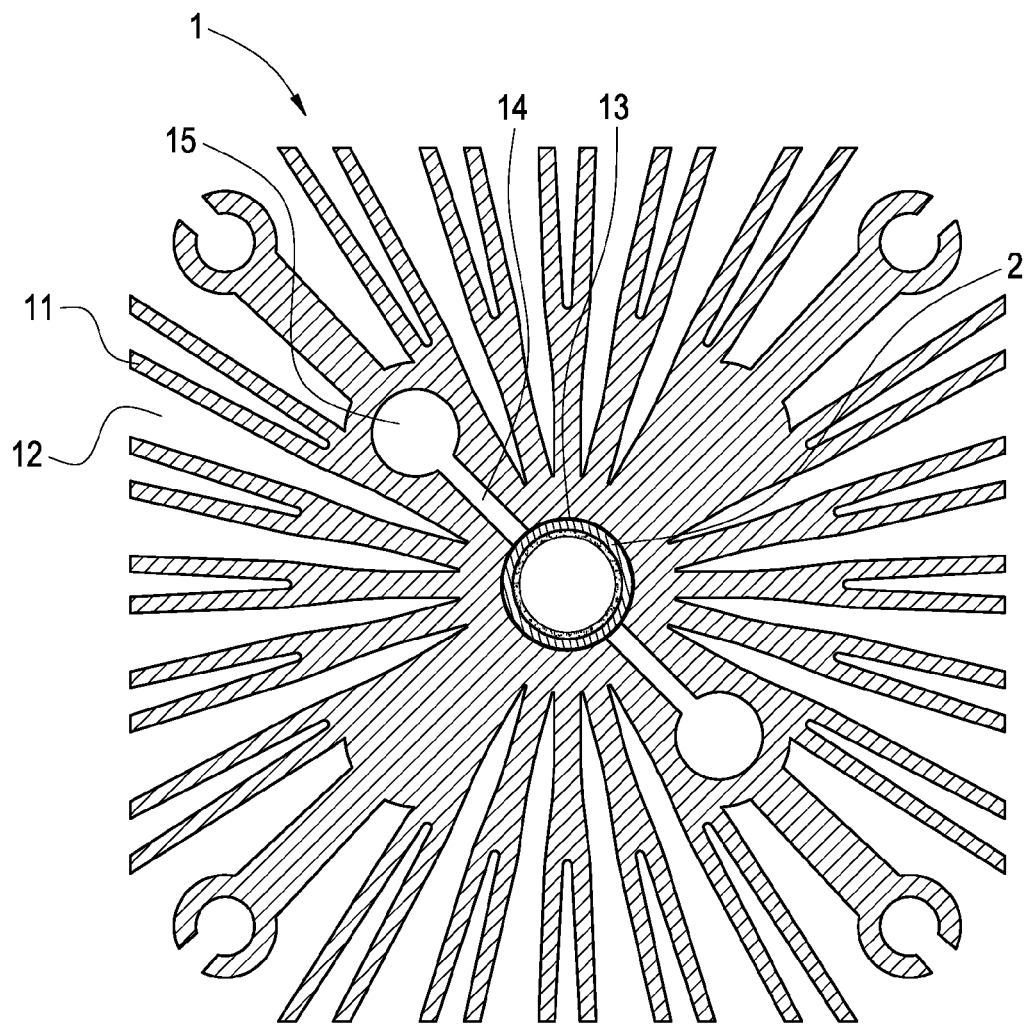
FIG. 6 is a schematic view (V) showing the procedure of the present invention.
Figure 7:
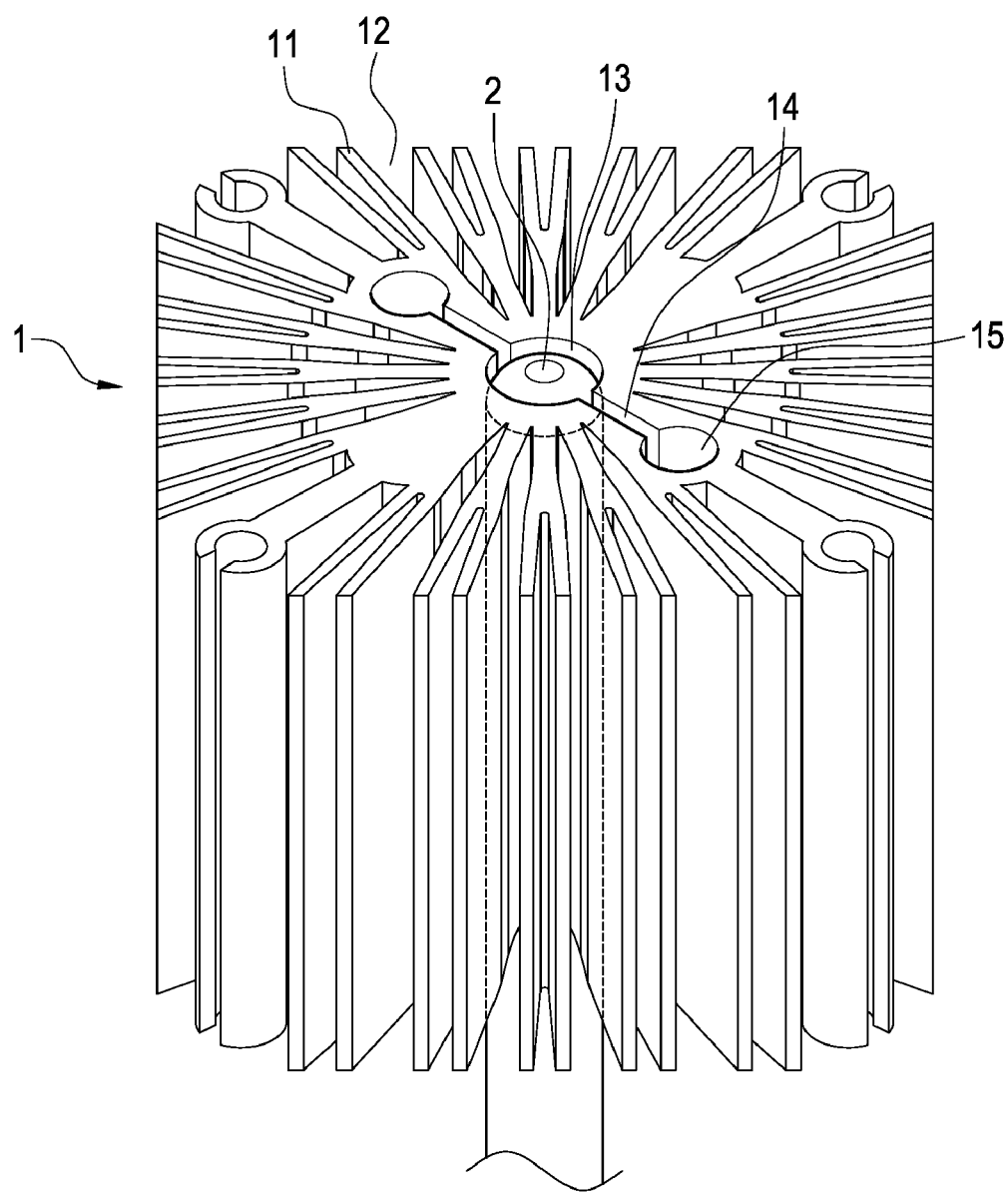
FIG. 7 is a schematic view showing the finished assembly of the present invention.

With reference to FIGS. 2 to 7, the procedure of the present invention will be described. As shown in FIG. 2, first, a heat-dissipating body 1 and tools 20 are provided. In the present embodiment, a plurality of tools 20 are provided. The profile of the tool 20 is flat with a tip at one end thereof. The tip of the tool 20 is inserted into the slot 14 of the heat-dissipating body 1. By means of machining technology, the tool 20 is gradually inserted into the slot 14 to widen the slot 14 outwardly. It is understood that each of the tools 20 is inserted into a corresponding slot 14, and the tool is inserted into the slot without passing through the trough. At the time of widening the slot 14, the inner circumference of the trough 13 is also widened outwardly. As shown in the arrow of the FIG. 3, the inner circumference of the trough 13 is made to be substantially larger than the outer circumference of the heat pipe 2. Thereafter, as shown in FIG. 4, one end of the heat pipe 2 penetrates into the trough 13 of the heat-dissipating body 1. Finally, as shown in FIG. 5, after one end of the heat pipe 2 is completely disposed in the trough 13, the tools 20 are taken out from the slots 14, thereby to recover the widened slots 14 and trough 13 to their original size. As shown in FIG. 6, the inner wall surface of the trough 13 abuts tightly against the outer circumferential surface of the heat pipe 2, thereby to complete the connecting structure of the heat-dissipating body 1 and the heat pipe 2. The finished assembly of the present invention is shown in FIG. 7.

Although the present invention has been described with reference to the foregoing preferred embodiment, it will be understood that the invention is not limited to the details thereof. Various equivalent variations and modifications can still be occurred to those skilled in this art in view of the teachings of the present invention. Thus, all such variations and equivalent modifications are also embraced within the scope of the invention as defined in the appended claims.

What is claimed is:

1. A method for assembling a heat-dissipating body and a heat pipe, the method comprising the steps in sequence of:
    a) providing the heat-dissipating body with a trough penetrating through the heat-dissipating body for accommodating the heat pipe, two through holes and two slots, the slots respectively connecting the through holes to the trough;
    b) providing two individual tools, each of the slots being inserted therein with one tool to widen outwardly the slots and the trough so that one end of the heat pipe penetrate into the trough; and
    c) removing the tools disposed within the slots, thereby to complete a connecting structure of the heat-dissipating body and the heat pipe.

2. The method according to claim 1, wherein the slots extends outwardly from the periphery of the trough.

3. The method according to claim 2, wherein the slots are aligned into a straight line.

4. The method according to claim 1, wherein each of the tools is flat with a tip at one end thereof.

5. The method according to claim 1, wherein the heat-dissipating body has a plurality of heat-dissipating pieces.

6. The method for according to claim 5, wherein the plurality of heat-dissipating pieces are radial.

7. The method according to claim 5, wherein a gap is formed between adjacent heat-dissipating pieces.

8. The method according to claim 1, wherein the trough is provided in a central position of the heat-dissipating body.

* * * * *